(12) United States Patent
Tsuchiya et al.

(10) Patent No.: US 6,235,071 B1
(45) Date of Patent: May 22, 2001

(54) CHEMICAL MECHANICAL POLISHING METHOD FOR HIGHLY ACCURATE IN-PLANE UNIFORMITY IN POLISHING RATE OVER POSITION

(75) Inventors: Yasuaki Tsuchiya; Mieko Suzuki, both of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/258,629

(22) Filed: Feb. 26, 1999

(30) Foreign Application Priority Data

Feb. 26, 1998 (JP) .................................. 10-045373

(51) Int. Cl.⁷ .............................. C09K 3/14; C09G 1/02; C09G 1/04; H01L 21/304
(52) U.S. Cl. ............................... 51/309; 106/3; 438/692; 438/693
(58) Field of Search ........................ 51/307, 309; 106/3; 438/692, 693; 510/397, 396, 175

(56) References Cited

U.S. PATENT DOCUMENTS

| | | | |
|---|---|---|---|
| 3,429,080 | * 2/1969 | Lachapelle | 51/309 |
| 5,340,370 | * 8/1994 | Cadien et al. | 106/3 |
| 5,527,423 | * 6/1996 | Neville et al. | 106/3 |
| 5,750,440 | * 5/1998 | Vanell et al. | 438/692 |
| 5,783,489 | * 7/1998 | Kaufman et al. | 51/309 |
| 5,858,813 | * 1/1999 | Scherber et al. | 438/693 |
| 5,897,375 | * 4/1999 | Watts et al. | 51/309 |
| 5,980,775 | * 11/1999 | Grumbine et al. | 51/309 |
| 5,993,686 | * 1/1999 | Streinz et al. | 51/309 |

FOREIGN PATENT DOCUMENTS

| | | | |
|---|---|---|---|
| 7-94455 | 4/1995 | (JP) | H01L/21/304 |
| 8-83780 | 3/1996 | (JP) | H01L/21/304 |
| 10-279926 | 10/1996 | (JP) | C08K/3/14 |
| 9-148431 | 6/1997 | (JP) | H01L/21/768 |

* cited by examiner

Primary Examiner—Michael Marcheschi
(74) Attorney, Agent, or Firm—Hayes, Soloway, Hennessey, Grossman & Hage, P.C.

(57) ABSTRACT

The present invention provides a chemical mechanical polishing method for polishing a soft metal by supplying a polishing surface of the soft metal with a novel polishing slurry which includes at least both alumina particles as polishing particles and hydrogen peroxide as oxidizing agent, wherein the content of the alumina particles is in the range of 2–10% by weight of the total amount of the polishing slurry.

6 Claims, 13 Drawing Sheets

Variation in polishing rate versus $H_2O_2$ concentration

Non-Uniformity in polishing rate over position

US 6,235,071 B1

CHEMICAL MECHANICAL POLISHING METHOD FOR HIGHLY ACCURATE IN-PLANE UNIFORMITY IN POLISHING RATE OVER POSITION

BACKGROUND OF THE INVENTION

The present invention relates to a method of polishing a metal interconnection layer, and more particularly to a chemical mechanical polishing method for obtaining highly accurate in-plane uniformity in polishing rate of a semiconductor wafer surface including buried metal interconnections such as copper interconnections.

A conventional method of forming a buried metal interconnection in a semiconductor wafer will be described with reference to FIGS. 1A through 1E.

With reference to FIG. 1A, an insulation layer 102 with an active region is formed on a semiconductor substrate 101.

With reference to FIG. 1B, a photo-resist pattern 105 is formed on the insulation layer 102. Thereafter, dry etching of the insulation layer 102 is carried out using the photo-resist pattern 105 as a mask thereby to form a contact hole 106 in the insulation layer 102 so that the contact hole 106 is positioned over the active region of the semiconductor substrate 101. A part of the active region of the semiconductor substrate 101 is thus shown through the contact hole 106. Thereafter, the used photo-resist pattern 105 is removed from the surface of the insulation layer 102.

With reference to FIG. 1C, a barrier layer 103 made of a metal such as Ti or Ta is formed covering the top surface of the insulation layer 102 as well as on side walls and a bottom of the contact hole 106 so that the barrier layer 103 is in contact with the part of the active region of the semiconductor substrate 101.

With reference to FIG. 1D, a conductive material 104 is deposited covering the barrier layer 103 so that the contact hole 106 is completely filled with the conductive material 104 and the conductive material 104 extends over the barrier layer 103 on the top surface of the conductive material 104.

With reference to FIG. 1E, a chemical mechanical polishing method is carried out to polish the surface of the conductive material 104 so that the conductive material 104 extending over the insulation layer 102 is removed whereby the conductive material 104 remains only within the contact hole 106. The chemical mechanical polishing is carried out by use of a chemical mechanical polishing apparatus which has a rotatable polishing plate 107 affixed with a polishing cloth. The wafer is fixed to a wafer carrier. The rotatable polishing plate 107 is made to rotate and brought into contact with the wafer surface so that the conductive material 104 is polished with the polishing cloth affixed on the rotating polishing plate 107, wherein a polishing slurry containing polishing particles such as alumina or silica particles and an etchant such as hydrogen peroxide are supplied onto the exposed surface of the conductive material 104 on the wafer.

The improvements of the chemical mechanical polishing method have taken into two distinct directions. The first one is to improve the compositions of the polishing agent used for the chemical mechanical polishing method. The second one is to improve the surface of the wafer being polished by the chemical mechanical polishing method.

Japanese laid-open patent publication No. 7-94455 addresses the improvement in the composition of the polishing agent, wherein it is suggested to use as an etchant, a hydrochloric acid solution, an ammonium persulfate solution, a chromium oxide solution, a phosphoric acid solution, an ammonium hydroxide solution, a solution containing both ammonium copper chloride and ammonium hydroxide, and a solution containing both ammonium and hydrogen peroxide as well as a mixture of those solutions. Those etchants provide effects of increase in polishing rate ratio of a metal layer to an insulation layer, so that the function of the insulation layer as a polishing stopper is enhanced, whereby the progress of polishing the metal layer extending both over the top surface of the insulation layer and within the through hole or groove in the insulation layer is stopped just when the top surface of the insulation layer is exposed. This makes it possible to achieve exact control in thickness of the metal interconnection. This conventional polishing method uses silicon dioxide particles having diameters of not larger than 0.1 micrometer as polishing particles. The hardness of the silicon dioxide particles is lower than alumina particles. Further, the silicon dioxide particles are fine particles. For those reasons, those silicon dioxide polishing particles are capable of polishing a soft metal layer such as a copper layer without scratching the soft metal layer, thereby resulting in no deterioration in characteristics of the soft metal interconnection.

The above first conventional polishing method is, however, plagued with a problem that a center region of the soft metal interconnection is over-etched by the etchant, whilst the top surface of the insulation layer is not etched due to the polishing stopper effect of the insulation layer.

The present inventors previously have proposed to improve the polishing surface structure to be polished by the chemical mechanical polishing method in order to solve the above problem. This second conventional chemical mechanical polishing method is disclosed in Japanese laid-open patent publication No. 9-148431. A through hole or a groove is formed in an insulation layer overlying a semiconductor substrate. A conductive layer is then formed which extends both over a top surface of the insulation layer and within the through hole or the groove. Further, a passivation layer is formed over the conductive layer. The passivation layer and the conductive layer are concurrently polished by the chemical mechanical polishing method so that the conductive layer remains only within the through hole or the groove in the insulation layer. Example 3 of the above Japanese publication provides the following descriptions. A via hole and an interconnection groove are formed in an insulation layer overlying a semiconductor substrate. A Ti/TiN barrier layer is entirely deposited by a sputtering method so that the Ti/TiN barrier layer covers both the top surface of the insulation layer and vertical side walls and bottoms of the via hole and the groove. A first copper interconnection layer is deposited on the Ti/TiN barrier layer by a chemical vapor deposition method, wherein the first copper interconnection layer has a thickness of one-third of a minimum diameter of the via hole formed in the insulation layer. A first passivation Ti layer having a thickness of 0.1 micrometers is then deposited on the first copper interconnection layer by a chemical vapor deposition method. A second copper interconnection layer is deposited on the first passivation Ti layer by a chemical vapor deposition method, wherein the second copper interconnection layer has a thickness of one-third of a maximum width of the groove formed in the insulation layer. A second passivation Ti layer having a thickness of 0.1 micrometers is then deposited on the second copper interconnection layer by a chemical vapor deposition method. The laminations of the Ti/TiN barrier layer, the first copper interconnection layer, the first passivation layer, the second copper interconnection layer and the second passivation layer are polished by a chemical mechanical polishing method by use of a polishing agent where a solid component concentration of alumina polishing particles is 12% and a ratio of water to hydrogen peroxide is 1:1, so that the laminations remain only within the via hole and the groove in the insulation layer. An acceptable solid component concentration of alumina polishing particles is in the range of 5%–33% and an acceptable ratio of water to hydrogen peroxide is in the range of 1:0.1 to 1:2.

The above second conventional chemical mechanical polishing method is effective to avoid any over-etching of the center portion of the interconnection in the groove or the contact in the via hole for the purpose of formation of no void in a center portion of the interconnection layer or in a center portion of the via hole. The above second conventional chemical mechanical polishing method is, however, disadvantageous in forming the passivation layers on the interconnection conductive layers. This means it necessary to increase the additional processes for depositing the passivation layers even those layers are then polished thereafter, for which reason the above second conventional chemical mechanical polishing method is undesirable in light of cost performance.

Meanwhile, the size of the wafer to be polished has been on the increase yearly. The major wafer size has been increased from 6-inches to 8–10 inches. The issue of polishing such large size wafer is how to realize a highly accurate uniformity in plane of the polished surface. If, for example, the polishing is poor or insufficient partially, the conductive layer may remain on a poorly or insufficiently polished surface. The remaining conductive layer on the poorly or insufficiently polished region may create a problem with a formation of a short circuit or cause leakage of current between interconnections. If, in order to solve this problem, the polishing is continued until the remaining conductive layer is completely removed from the above region, another problem is created with over-etching of the conductive layer on other regions than the above region. Such over-etching of the conductive layer reduces the thickness of the interconnection layer. The reduction in thickness of the interconnection layer increases the resistance of the interconnection. This increase in the resistance of the interconnection deteriorates an electron migration resistance of the interconnection layer.

In the above circumstances, it had been required to develop a novel chemical mechanical polishing method free from the above problems and disadvantages.

SUMMARY OF THE INVENTION

Accordingly, it is an object of the present invention to provide a novel chemical mechanical polishing method free from the above problems.

It is a further object of the present invention to provide a novel chemical mechanical polishing method which is advantageous in cost performance.

It is a still further object of the present invention to provide a novel chemical mechanical polishing method which entails a relatively simple process.

It is yet a further object of the present invention to provide a novel chemical mechanical polishing method which is capable of achieving a highly accurate in-plane flatness of a polished surface of a metal layer even when the wafer size is large.

It is a further more object of the present invention to provide a novel chemical mechanical polishing method which is capable of realizing a highly accurate in-plane uniformity in polishing rate of a polished surface of a metal layer even when the wafer size is large.

It is still more object of the present invention to provide a novel chemical mechanical polishing method realizable by easy operations.

The first embodiment of the present invention provides a novel polishing slurry to be supplied on a polishing surface of a soft metal in a chemical mechanical polishing method, wherein the polishing slurry includes at least both alumina particles as polishing particles and hydrogen peroxide as oxidizing agent, wherein the content of the alumina particles is in a range of 2–10% by weight of a total amount of the polishing slurry.

The second embodiment of the present invention provides a novel method of preparing an alumina slurry to be supplied on a polishing surface of a soft metal in a chemical mechanical polishing method, the method comprising the steps of: causing precipitation of a solid component of the alumina slurry; removing a part of a supernatant liquid component; and adding hydrogen peroxide to the alumina slurry so that the content of alumina particles in the alumina slurry is in a range of 2–10% by weight of a total amount of the alumina slurry and the concentration of hydrogen peroxide in the polishing slurry is in the range of 8–26% by weight of the liquid component of the alumina slurry.

The third embodiment of the present invention provides a chemical mechanical polishing method for polishing a soft metal by supplying a polishing surface of the soft metal with a novel polishing slurry which includes at least both alumina particles as polishing particles and hydrogen peroxide as oxidizing agent, wherein the content of the alumina particles is in a range of 2–10% by weight of a total amount of the polishing slurry.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
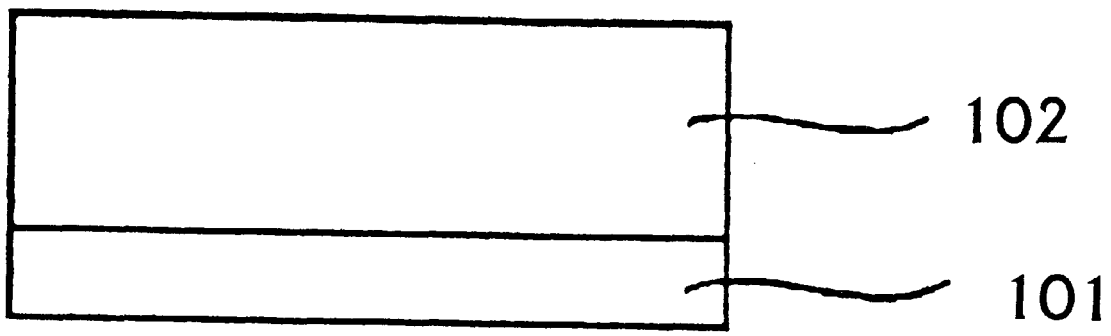
FIGS. 1A through 1E are fragmentary cross sectional elevation views illustrative of semiconductor wafers covered with insulating layers in sequential steps involved in a conventional method of forming a buried metal interconnection in the semiconductor wafer.
Figure 1B:
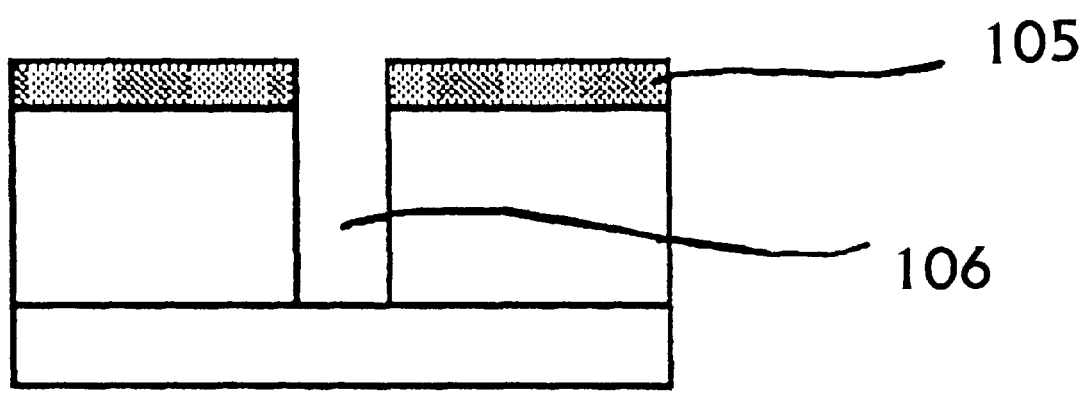
Figure 1C:
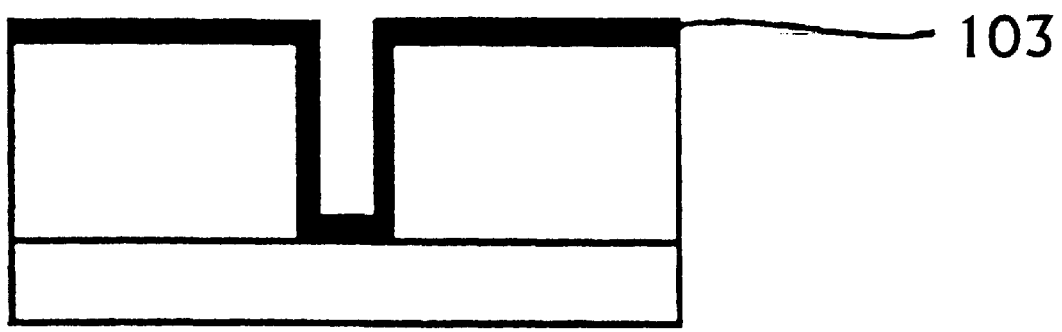
Figure 1D:
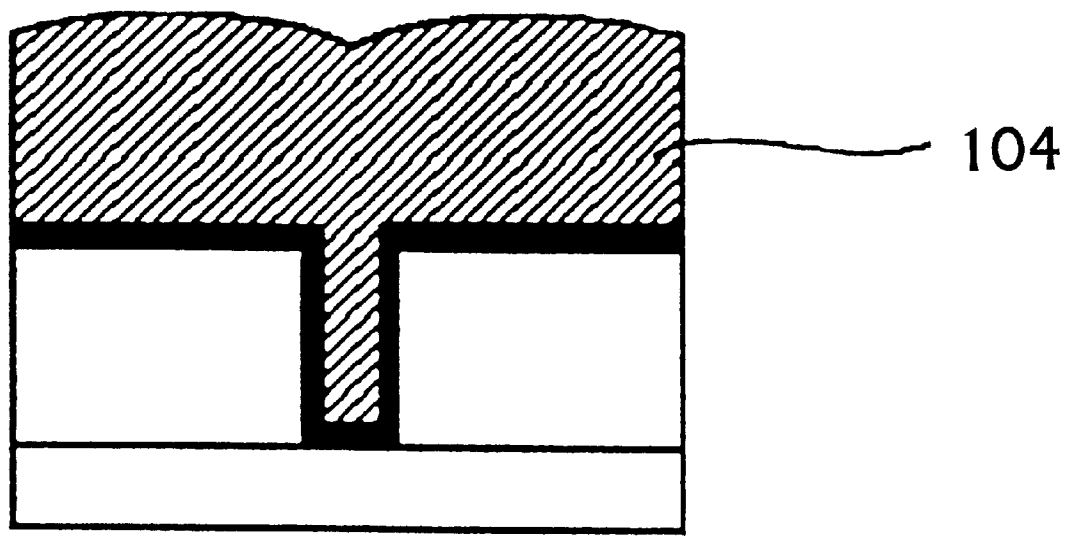
Figure 1E:
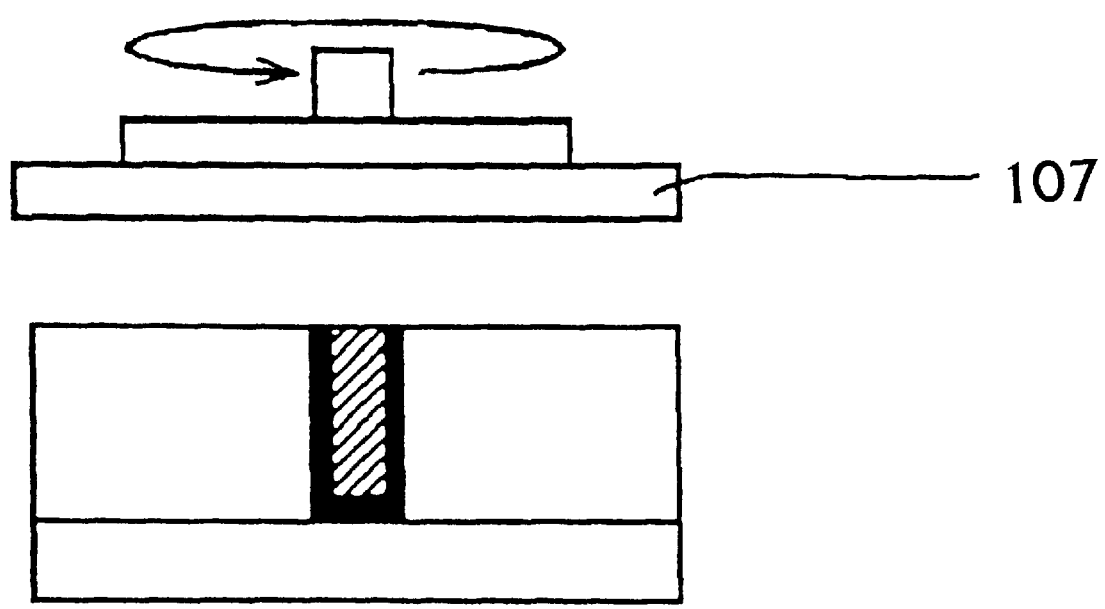

The present invention is directed to an improvement of a polishing agent which is capable of achieving highly accurate in-plane uniformity in polishing rate of a polished surface of a metal layer on a large size wafer without, however, requiring a passivation film. The present invention was achieved by identifying an acceptable range of the content of alumina particles as polishing particles in a polishing slurry.

The first embodiment of the present invention provides a novel polishing slurry to be supplied on a polishing surface of a soft metal in a chemical mechanical polishing method, and the polishing slurry includes at least both alumina particles as polishing particles and hydrogen peroxide as oxidizing agent, wherein the content of the alumina particles is in a range of 2–10% by weight of a total amount of the polishing slurry.

In accordance with the present invention, the content of the alumina particles in the novel polishing slurry is intentionally increased to be much higher than the content of the alumina particles in a conventionally used polishing slurry. The commercially available unadjusted polishing slurry has the alumina particles at a solid component concentration of 3% by weight. In the prior art, a hydrogen peroxide solution is added to the commercially available unadjusted polishing slurry for adjustment of the solid component concentration to less than 2% by weight in use. Namely, before the present invention was made by the present inventors, ones having ordinary skill in the art had considered that a low solid component concentration of less than 2% by weight in use would be sufficient for polishing a soft metal layer such as a copper layer but not a hard passivation layer such as a titanium nitride layer. It is the common knowledge generally available to ones having ordinary skill in the art at the time when the present invention was made that, in order to polish a soft metal layer, it is preferable to reduce the solid component concentration of the polishing slurry because it is unnecessary to increase the content of the polishing particles for polishing the soft metal layer. Notwithstanding, it may be presumable to ones having ordinary skill in the art to increase the content of the polishing particles in the polishing slurry for polishing the hard layer such as passivation layers such as titanium nitride layer. The present inventors, however, have dared to increase the content of the polishing particles in the polishing slurry for polishing the soft metal layer such as copper layer in order to achieve a highly accurate in-plane uniformity in polishing rate over an entire region of the soft metal layer on a large size wafer, even the soft metal layer can sufficiently be polished by a polishing slurry with a reduced content of the polishing particles. No knowledge nor information about the dependency of the in-plane uniformity in polishing rate upon the content of the polishing particles in the polishing slurry and also upon the concentration of hydrogen peroxide in the polishing slurry was generally available to ones having ordinary skill in the art at the time when the present invention was made. In the above circumstances, it was an unexpectable result to ones having ordinary skill in the art at the time when the present invention was made that the intentional increase in the contact of the polishing particles in the polishing slurry into the specific range, for example, 2–10% by weight of the total amount of the polishing slurry would result in improvement in the in-plane uniformity in the polishing rate of the soft metal layer such as copper layer. The above novel polishing slurry can be obtained by modifying a commercially available slurry to cause a precipitation of a solid component of the alumina slurry so as to remove a part of a supernatant liquid component of the slurry before adding hydrogen peroxide to the polishing slurry, so that the content of alumina particles in the alumina slurry is in a range of 2–10% by weight of the total amount of the alumina slurry and also the concentration of hydrogen peroxide in the polishing slurry is in the range of 8–26% by weight of the liquid component of the alumina slurry.

It was confirmed that so long as the above novel polishing slurry is used for polishing the soft metal layer such as the copper layer, an extremely highly accurate in-plane uniformity in polishing rate of the soft metal layer such as the copper layer can be obtained under various polishing conditions such as various polishing pressure, rotation speed and various polishing rates having generally been used.

In addition, no knowledge nor information about the dependency of the in-plane uniformity in polishing rate upon the concentration of hydrogen peroxide in the polishing slurry was generally known to ones having ordinary skill in the art at the time when the present invention was made. In the above circumstances, it would be unexpectable result to ones having ordinary skill in the art at the time when the present invention was made that a specific adjustment in the concentration of hydrogen peroxide in the polishing slurry to the specific range, for example, 8–26% by weight of a liquid component of the alumina slurry would result in further improvement in in-plane uniformity in the polishing rate of the soft metal layer such as copper layer.

It is preferable that the content of the alumina particles is in a range of 3–8% by weight of a total amount of the polishing slurry.

It is also preferable that a concentration of hydrogen peroxide in the polishing slurry is in the range of 8–26% by weight of a liquid component of the polishing slurry.

It is further preferable that the concentration of hydrogen peroxide in the polishing slurry is in the range of 9–25.5% by weight of a liquid component of the polishing slurry.

It is further more preferable that the concentration of hydrogen peroxide in the polishing slurry is in the range of 10–20% by weight of a liquid component of the polishing slurry.

The second embodiment of the present invention provides a novel method of preparing an alumina slurry to be supplied to a polishing surface of a soft metal in a chemical mechanical polishing method, the method comprising the steps of: causing precipitation of a solid component of the alumina slurry; removing a part of a supernatant liquid component; and adding hydrogen peroxide to the alumina slurry so that the content of alumina particles in the alumina slurry is in a range of 2–10% by weight of the total amount of the alumina slurry and also the concentration of hydrogen peroxide in the polishing slurry is in the range of 8–26% by weight of the liquid component of the alumina slurry.

In accordance with the present invention, the content of the alumina particles in the novel polishing slurry is intentionally increased to be much higher than the content of the alumina particles in a conventionally used polishing slurry. The commercially available unadjusted polishing slurry has alumina particles at a solid component concentration of 3% by weight. In the prior art, a hydrogen peroxide solution is added to a commercially available unadjusted polishing slurry for adjustment of the solid component concentration to less than 2% by weight in use. Namely, before the present invention was made by the present inventors, ones having ordinary skill in the art had considered that a low solid component concentration of less than 2% by weight in use would be sufficient for polishing a soft metal layer such as a copper layer but a hard passivation layer such as a titanium nitride layer. It is the common knowledge generally available to ones having ordinary skill in the art at the time when the present invention was made that, in order to polish a soft metal layer, it is preferable to reduce the solid component concentration of the polishing slurry because it is unnecessary to increase the content of the polishing particles for polishing the soft metal layer. Notwithstanding, it may be presumable to ones having ordinary skill in the art to increase the content of the polishing particles in the polishing slurry for polishing the hard layer such as passivation layers such as titanium nitride layer. The present inventors, however, have dared to increase the content of the polishing particles in the polishing slurry for polishing the soft metal layer such as copper layer in order to achieve a highly accurate in-plane uniformity in polishing rate over an entire region of the soft metal layer on a large size wafer, even the soft metal layer can sufficiently be polished by a polishing slurry with a reduced content of the polishing particles. No knowledge nor information about dependency of the in-plane uniformity in polishing rate upon the content of the polishing particles in the polishing slurry and also upon the concentration of hydrogen peroxide in the polishing slurry was generally available to ones having ordinary skill in the art at the time when the present invention was made. In the above circumstances, it was an unexpectable result to ones having ordinary skill in the art at the time when the present invention was made that the intentional increase in the contact of the polishing particles in the polishing slurry to the specific range, for example, 2–10% by weight of a total amount of the polishing slurry would result in improvement in the in-plane uniformity in the polishing rate of the soft metal layer such as copper layer. The above novel polishing slurry can be obtained by modifying a commercially available slurry to cause a precipitation of a solid component of the alumina slurry so as to remove a part of a supernatant liquid component of the slurry before adding hydrogen peroxide to the polishing slurry, so that the content of alumina particles in the alumina slurry is in a range of 2–10% by weight of the total amount of the alumina slurry and also the concentration of hydrogen peroxide in the polishing slurry is in the range of 8–26% by weight of the liquid component of the alumina slurry.

It was confirmed that so long as the above novel polishing slurry is used for polishing the soft metal layer such as the copper layer, an extremely highly accurate in-plane uniformity in polishing rate of the soft metal layer such as the copper layer can be obtained under various polishing conditions such as various polishing pressure, rotation speed and various polishing rates having generally been used.

In addition, no knowledge nor information about the dependency of the in-plane uniformity in polishing rate upon the concentration of hydrogen peroxide in the polishing slurry was generally known to ones having ordinary skill in the art at the time when the present invention was made. In the above circumstances, it would be unexpectable result to ones having ordinary skill in the art at the time when the present invention was made that a specific adjustment in the concentration of hydrogen peroxide in the polishing slurry to the specific range, for example, 8–26% by weight of a liquid component of the alumina slurry would result in further improvement in in-plane uniformity in the polishing rate of the soft metal layer such as copper layer.

It is preferable that the content of the alumina particles is in a range of 3–8% by weight of a total amount of the polishing slurry.

It is further preferable that the concentration of hydrogen peroxide in the polishing slurry is in the range of 9–25.5% by weight of a liquid component of the polishing slurry.

It is further more preferable that the concentration of hydrogen peroxide in the polishing slurry is in the range of 10–20% by weight of a liquid component of the polishing slurry.

The third embodiment of the present invention provides a chemical mechanical polishing method for polishing a soft metal by supplying a polishing surface of the soft metal with a novel polishing slurry which includes at least both alumina particles as polishing particles and hydrogen peroxide as oxidizing agent, wherein the content of the alumina particles is in a range of 2–10% by weight of a total amount of the polishing slurry.

In accordance with the present invention, the content of the alumina particles in the novel polishing slurry is intentionally increased to be much higher than the content of the alumina particles in a conventionally used polishing slurry. The commercially available unadjusted polishing slurry has the alumina particles at a solid component concentration of 3% by weight. In the prior art, a hydrogen peroxide solution is added to a commercially available unadjusted polishing slurry for adjustment of the solid component concentration to less than 2% by weight in use. Namely, before the present invention was made by the present inventors, ones having ordinary skill in the art had considered that a low solid component concentration of less than 2% by weight in use would be sufficient for polishing a soft metal layer such as a copper layer but not a hard passivation layer such as a titanium nitride layer. It is the common knowledge generally available to ones having ordinary skill in the art at the time when the present invention was made that, in order to polish a soft metal layer, it is preferable to reduce the solid component concentration of the polishing slurry because it is unnecessary to increase the content of the polishing particles for polishing the soft metal layer. Notwithstanding, it may be presumable to ones having ordinary skill in the art to increase the content of the polishing particles in the polishing slurry for polishing the hard layer such as passivation layers such as titanium nitride layer. The present inventors, however, have dared to increase the content of the polishing particles in the polishing slurry for polishing the soft metal layer such as copper layer in order to achieve a highly accurate in-plane uniformity in polishing rate over an entire region of the soft metal layer on a large size wafer, even the soft metal layer can sufficiently be polished by a polishing slurry with a reduced content of the polishing particles. No knowledge nor information about dependency of the in-plane uniformity in polishing rate upon the content of the polishing particles in the polishing slurry and also upon the concentration of hydrogen peroxide in the polishing slurry was generally available to ones having ordinary skill in the art at the time when the present invention was made. In the above circumstances, it was an unexpectable result to ones having ordinary skill in the art at the time when the present invention was made that the intentional increase in the contact of the polishing particles in the polishing slurry into the specific range, for example, 2–10% by weight of the total amount of the polishing slurry would result in improvement in the in-plane uniformity in the polishing rate of the soft metal layer such as copper layer. The above novel polishing slurry can be obtained by modifying a commercially available slurry to cause a precipitation of a solid component of the alumina slurry so as to remove a part of a supernatant liquid component of the slurry before adding hydrogen peroxide to the polishing slurry, so that the content of alumina particles in the alumina slurry is in a range of 2–10% by weight of the total amount of the alumina slurry and also the concentration of hydrogen peroxide in the polishing slurry is in the range of 8–26% by weight of a liquid component of the alumina slurry.

It was confirmed that so long as the above novel polishing slurry is used for polishing the soft metal layer such as the copper layer, an extremely highly accurate in-plane uniformity in polishing rate of the soft metal layer such as the copper layer can be obtained under various polishing conditions such as various polishing pressure, rotation speed and various polishing rates having generally been used.

In addition, no knowledge nor information about dependency of the in-plane uniformity in polishing rate upon the concentration of hydrogen peroxide in the polishing slurry was generally available to ones having ordinary skill in the art at the time when the present invention was made. In the above circumstances, it was an unexpectable result to ones having ordinary skill in the art at the time when the present invention was made that a specific adjustment in the concentration of hydrogen peroxide in the polishing slurry into the specific range, for example, 8–26% by weight of the liquid component of the alumina slurry would result in further improvement in the in-plane uniformity in the polishing rate of the soft metal layer such as copper layer.

It is preferable that the content of the alumina particles is in a range of 3–8% by weight of a total amount of the polishing slurry.

It is also preferable that a concentration of hydrogen peroxide in the polishing slurry is in the range of 8–26% by weight of a liquid component of the polishing slurry.

It is further preferable that the concentration of hydrogen peroxide in the polishing slurry is in the range of 9–25.5% by weight of a liquid component of the polishing slurry.

It is further more preferable that the concentration of hydrogen peroxide in the polishing slurry is in the range of 10–20% by weight of a liquid component of the polishing slurry.

PREFERRED EXAMPLES

Example 1

A first example according to the present invention will be described. A polishing sample were prepared as follows. A silicon wafer was prepared. A silicon dioxide layer was formed on the top surface of the silicon wafer. A barrier layer was formed on the silicon dioxide layer. A sputtering method was carried out by sputtering a copper target to deposit a copper layer having a thickness of 100–200 nanometers and subsequently a plating method of copper was then carried out to form a copper layer having a uniform thickness of 1.2 micrometers.

Chemical mechanical polishing methods were carried out under conditions of a fixed polishing pressure of 3 psi and a fixed rotation speed of 25 rpm using variations of polishing slurries in order to elevate the in-plane uniformity in polishing rate over an entire region of the wafer with the copper layer.

The polishing slurries with various compositions were prepared by modifying commercially available alumina slurries to cause precipitation of the solid component of each of the alumina slurries so as to partially remove the supernatant liquid component of the each slurry by individual amounts before adding individual amounts of 35%-hydrogen peroxide solution to the polishing slurries, so that various contents of alumina particles in the alumina slurries are in the range of 2–10% by weight of the total amount of the alumina slurry and also various concentrations of hydrogen peroxide in the polishing slurries are in the range of 8–26% by weight of the liquid component of the alumina slurries.

Figure 2:
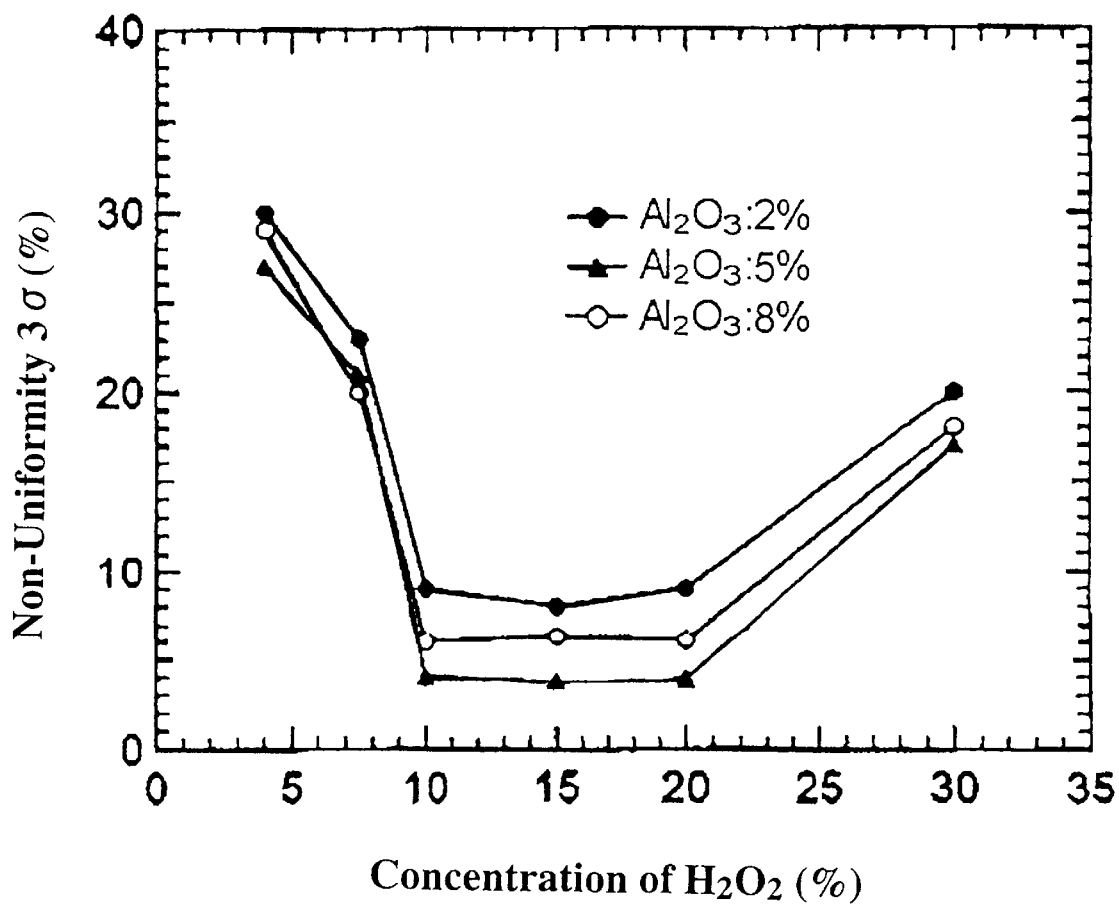
FIG. 2 is a diagram illustrative of in-plane non-uniformity ($3\sigma\%$) in polishing rate of a wafer with a copper layer versus concentration of hydrogen peroxide in the range of 0% to 35% for different three alumina concentrations of 2%, 5% and 8% in accordance with the present invention.

FIG. 2 is a diagram illustrative of in-plane non-uniformity ($3\sigma\%$) in polishing rate of a wafer with a copper layer versus concentration of hydrogen peroxide in the range of 0% to 35% for three different alumina concentrations of 2%, 5% and 8%. As the in-plane non-uniformity ($3\sigma\%$) in polishing rate of a wafer with a copper layer is within 15%, there is no problem in accuracy in-plane uniformity in practice. The acceptable range of the concentration of hydrogen peroxide is 8–26% by weight, preferably 9–25.5% by weight and more preferably 10–20% by weight.

Figure 3:
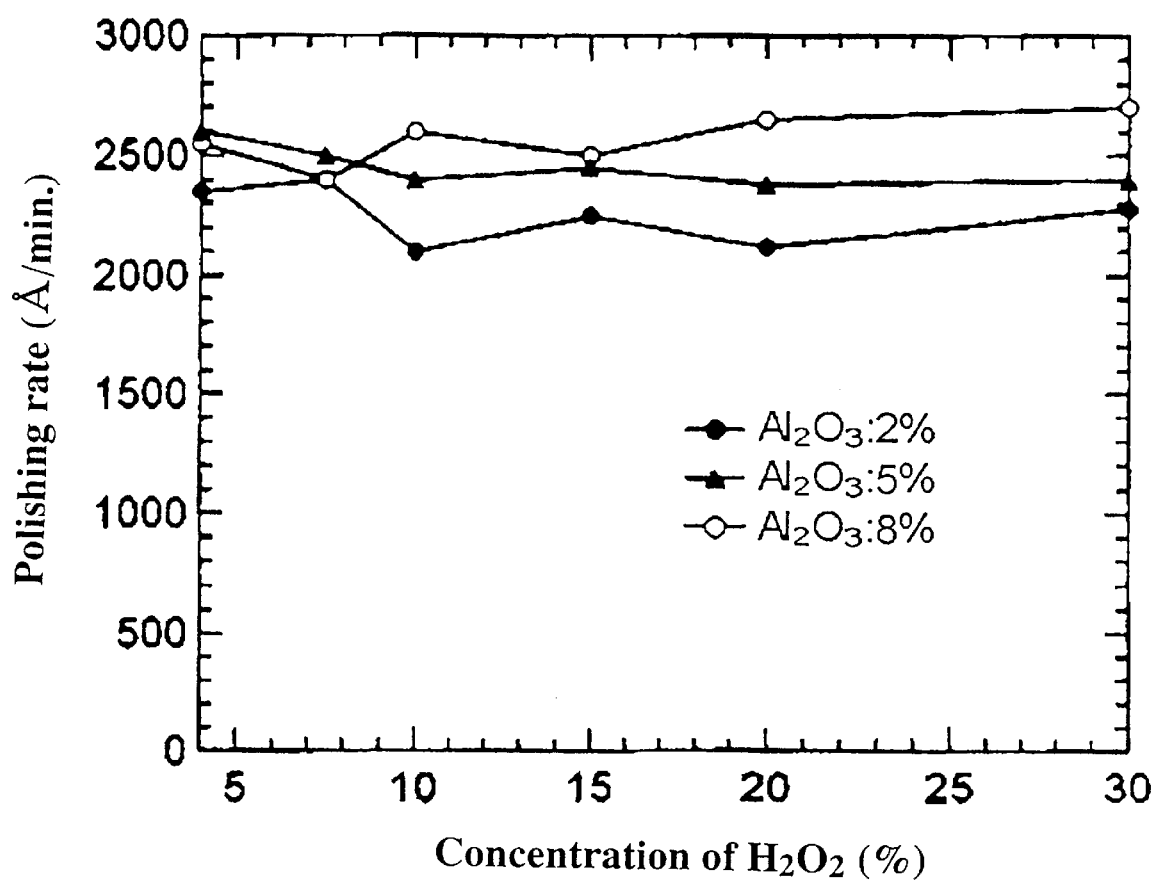
FIG. 3 is a diagram illustrative of variation in polishing rate of a copper layer versus concentration of hydrogen peroxide in the range of 5% to 30% for different three alumina concentrations of 2%, 5% and 8% in accordance with the present invention.

FIG. 3 is a diagram illustrative of variation in polishing rate of a copper layer versus concentration of hydrogen peroxide in the range of 5% to 30% for three different alumina concentrations of 2%, 5% and 8%. The variations in polishing rate of a copper layer versus concentration of hydrogen peroxide in the range of 5% to 30% is small for each of the three different alumina concentrations of 2%, 5% and 8%.

Figure 4:
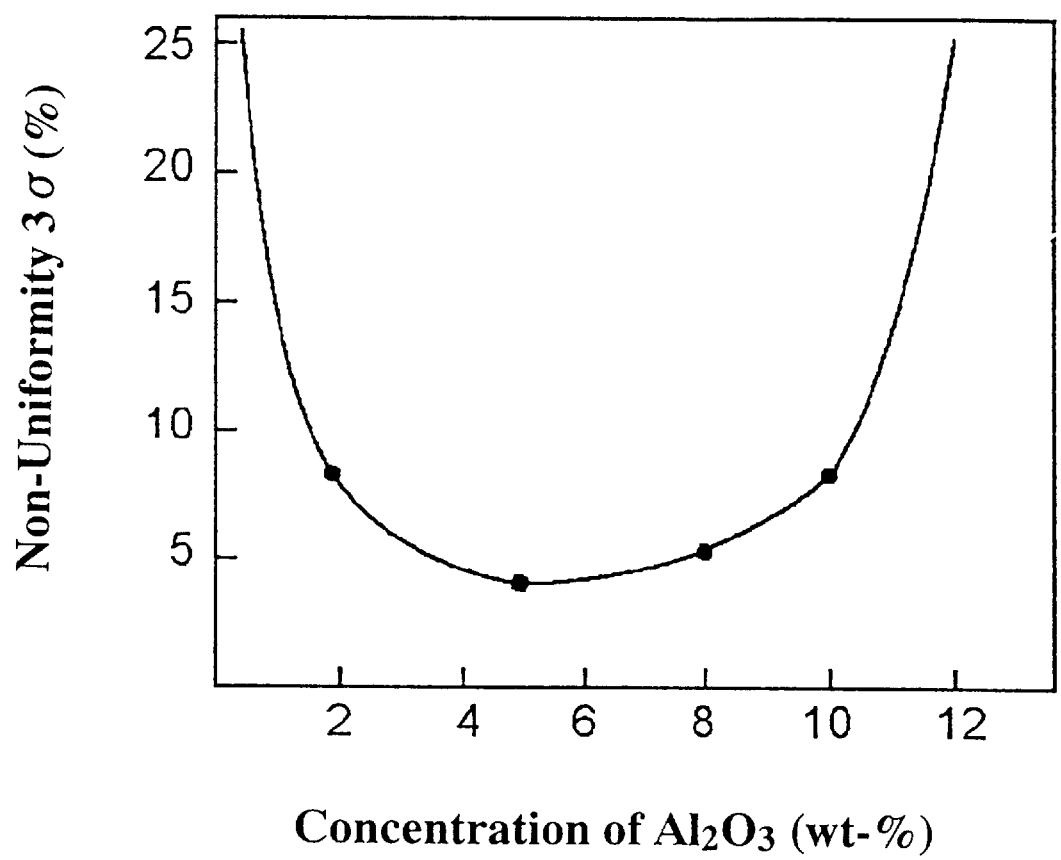
FIG. 4 is a diagram illustrative of in-plane non-uniformity ($3\sigma\%$) in polishing rate of a wafer with a copper layer versus concentration of alumina in the range of 0% by weight to 12% by weight, wherein the concentration of hydrogen peroxide is fixed at 15% by weight in accordance with the present invention.

FIG. 4 is a diagram illustrative of in-plane non-uniformity ($3\sigma\%$) in polishing rate of a wafer with a copper layer versus concentration of alumina in the range of 0% by weight to 12% by weight, wherein the concentration of hydrogen peroxide is fixed at 15% by weight. As the in-plane non-uniformity ($3\sigma\%$) in polishing rate over a wafer with a copper layer is within 15%, there is no problem in accuracy in-plane uniformity in practice. The acceptable range of the concentration of alumina is 2–10% by weight.

Further, in order to evaluate electron migration resistance, a semiconductor device was formed as follows. FIGS. 5A through 5E are fragmentary cross sectional elevation views illustrative of semiconductor devices in sequential processes involved in a novel chemical mechanical polishing method.

Figure 5A:
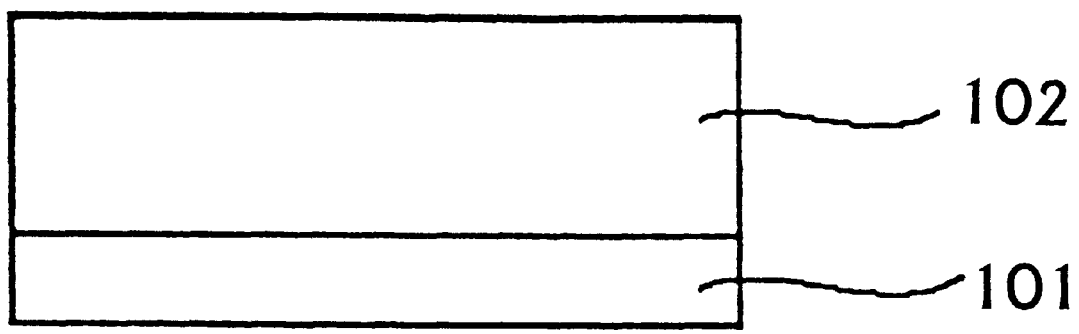
FIGS. 5A through 5E are fragmentary cross sectional elevation views illustrative of semiconductor devices in sequential processes involved in a novel chemical mechanical polishing method in accordance with the present invention.

With reference to FIG. 5A, an insulation layer 102 with an active region is formed on a semiconductor substrate 101.

Figure 5B:
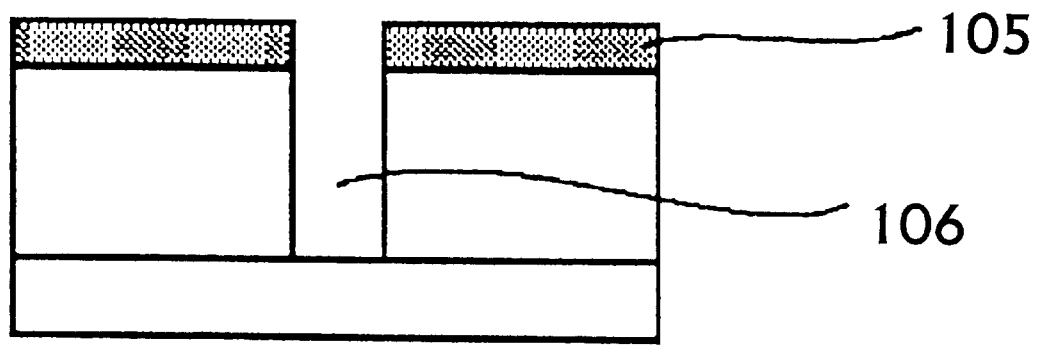

With reference to FIG. 5B, a photo-resist pattern 105 is formed on the insulation layer 102, and dry etching of the insulation layer 102 is carried out using the photo-resist pattern 105 as a mask thereby to form a contact hole 106 in the insulation layer 102 so that the contact hole 106 is positioned over the active region of the semiconductor substrate 101. A part of the active region of the semiconductor substrate 101 is thus shown through the contact hole 106. Thereafter, the used photo-resist pattern 105 is removed from the surface of the insulation layer 102.

Figure 5C:
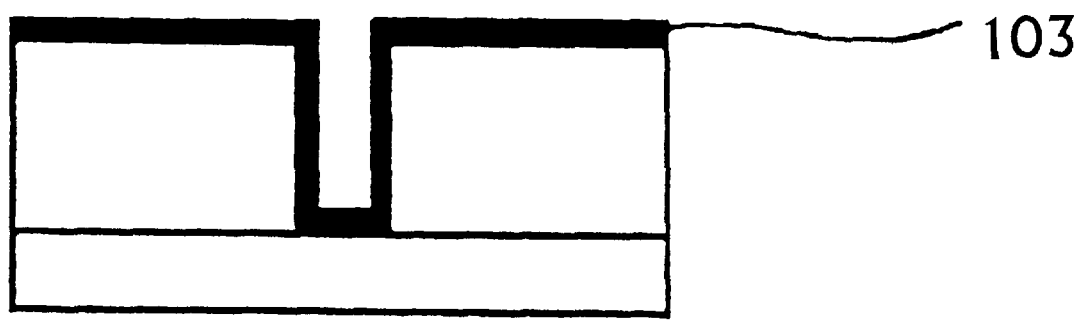

With reference to FIG. 5C, a barrier layer 103 made of a metal such as Ti or Ta is covering the a top surface of the insulation layer 102 as well as on side walls and a bottom of the contact hole 106 so that the barrier layer 103 is made in contact with the part of the active region of the semiconductor substrate 101.

Figure 5D:
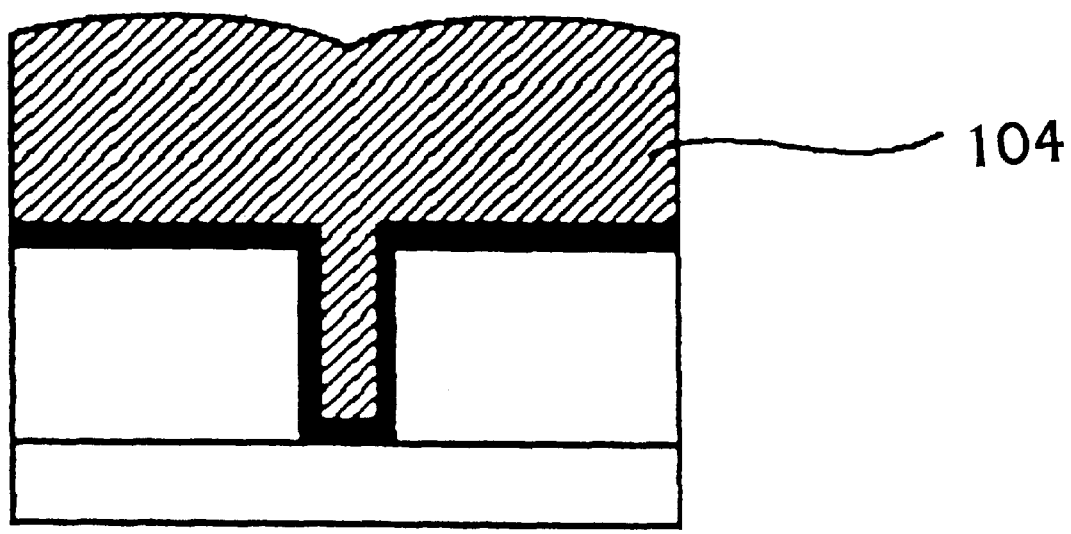

With reference to FIG. 5D, a copper material 104 is deposited covering the barrier layer 103 so that the contact hole 106 is completely filled with the copper material 104 and the copper material 104 extends over the barrier layer 103 on the top surface of the copper material 104.

Figure 5E:
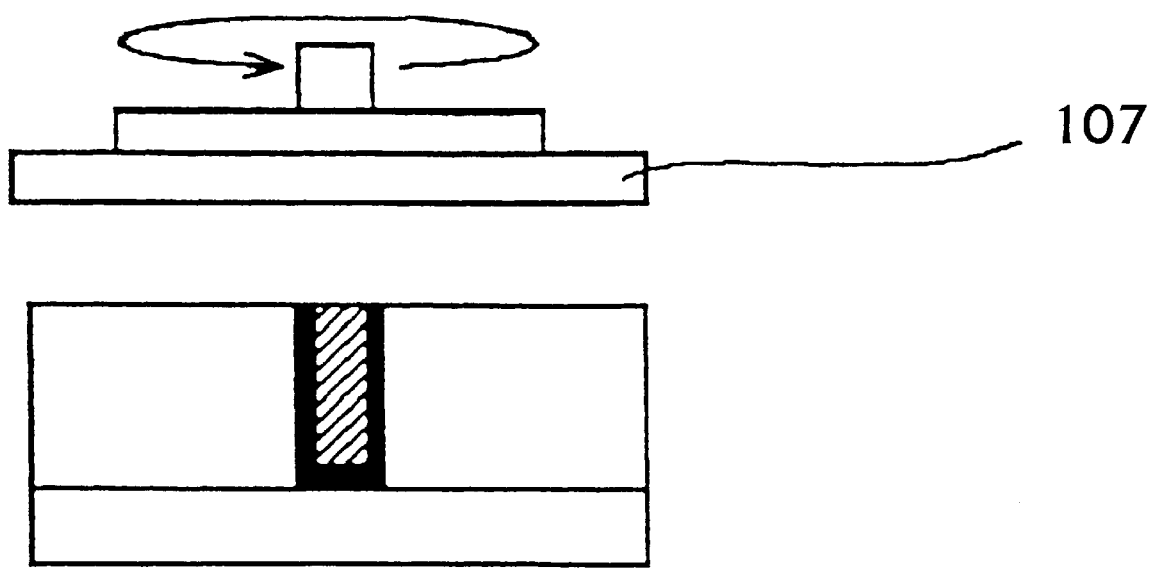

With reference to FIG. 5E, a chemical mechanical polishing method is carried out to polish a surface of the copper material 104 so that the copper material 104 extending over the insulation layer 102 is removed whereby the copper material 104 remains only within the contact hole 106. The chemical mechanical polishing is carried out by use of a chemical mechanical polishing apparatus which has a rotatable polishing plate 107 affixed with a polishing cloth. The wafer is fixed to a wafer carrier. The rotatable polishing plate 107 is made rotate and is brought into contact with the wafer surface so that the copper material 104 is polished with the polishing cloth affixed on the rotating polishing plate 107, wherein a polishing slurry containing polishing particles of alumina particles and an etchant of hydrogen peroxide is supplied onto the polishing surface of the copper material 104 on the wafer. A 34%-hydrogen peroxide solution was added to the alumina slurry just before the polishing process has been started, wherein the content of alumina particles is 5% by weight of the total weight of the slurry and the concentration of hydrogen peroxide is 15% by weight of the total weight of the liquid component of the slurry. It was confirmed that the semiconductor device formed via the above novel chemical mechanical polishing method shows good electron migration resistance.

In accordance with the present invention, the content of the alumina particles in the novel polishing slurry is intentionally increased to be much higher than the content of the alumina particles in a conventionally used polishing slurry. The commercially available unadjusted polishing slurry has the alumina particles at a solid component concentration of 3% by weight. In the prior art, a hydrogen peroxide solution is added to a commercially available unadjusted polishing slurry for adjustment of the solid component concentration to less than 2% by weight in use. Namely, before the present invention was made by the present inventors, ones having ordinary skill in the art had considered that a low solid component concentration of less than 2% by weight in use would be sufficient for polishing a soft metal layer such as a copper layer but not a hard passivation layer such as a titanium nitride layer. It is common knowledge generally available to ones having ordinary skill in the art at the time when the present invention was made that, in order to polish a soft metal layer, it is preferable to reduce the solid component concentration of the polishing slurry because it is unnecessary to increase the content of the polishing particles for polishing the soft metal layer. Notwithstanding, it may be presumable to ones having ordinary skill in the art to increase the content of the polishing particles in the polishing slurry for polishing the hard layer such as passivation layers such as titanium nitride layer. The present inventors, however, have dared to increase the content of the polishing particles in the polishing slurry for polishing the soft metal layer such as copper layer order to achieve a highly accurate in-plane uniformity in polishing rate over an entire region of the soft metal layer on a large size wafer, even the soft metal layer can sufficiently be polished by a polishing slurry with a reduced content of the polishing particles. No knowledge nor information about dependency of the in-plane uniformity in polishing rate upon the content of the polishing particles in the polishing slurry and also upon the concentration of hydrogen peroxide in the polishing slurry was generally available to ones having ordinary skill in the art at the time when the present invention was made. In the above circumstances, it was an unexpectable result to ones having ordinary skill in the art at the time when the present invention was made that the intentional increase in the contact of the polishing particles in the polishing slurry to the specific range, for example, 2–10% by weight of the total amount of the polishing slurry would result in improvement in the in-plane uniformity in the polishing rate of the soft metal layer such as copper layer. The above novel polishing slurry can be obtained by modifying a commercially available slurry to cause a precipitation of the solid component of the alumina slurry so as to remove the part of a supernatant liquid component of the slurry before adding hydrogen peroxide to the polishing slurry, so that the content of alumina particles in the alumina slurry is in the range of 2–10% by weight of a total amount of the alumina slurry and also the concentration of hydrogen peroxide in the polishing slurry is in the range of 8–26% by weight of the liquid component of the alumina slurry.

It was confirmed that so long as the above novel polishing slurry is used for polishing the soft metal layer such as the copper layer, an extremely highly accurate in-plane uniformity in polishing rate of the soft metal layer such as the copper layer can be obtained under various polishing conditions such as various polishing pressure, rotation speed and various polishing rates having generally been used.

In addition, no knowledge nor information about dependency of the in-plane uniformity in polishing rate upon the concentration of hydrogen peroxide in the polishing slurry was generally available to ones having ordinary skill in the art at the time when the present invention was made. In the above circumstances, it was an unexpectable result to ones having ordinary skill in the art at the time when the present invention was made that a specific adjustment in the concentration of hydrogen peroxide in the polishing slurry to the specific range, for example, 8–26% by weight of the liquid component of the alumina slurry would result in further improvement in the in-plane uniformity in the polishing rate of the soft metal layer such as copper layer.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A polishing slurry for polishing the surface of a soft metal in a chemical mechanical polishing method, said polishing slurry consisting essentially of a mixture of alumina particles as polishing particles and hydrogen peroxide as oxidizing agent in a liquid, wherein said alumina particles are present in an amount in a range of 2–10% by weight of said polishing slurry, and said hydrogen peroxide is present in the range of 10–20% by weight of the liquid component of the slurry.

2. The polishing slurry as claimed in claim 1, wherein said alumina particles are present in an amount in a range of 3–8% by weight of said polishing slurry.

3. A method of preparing an alumina particle containing polishing slurry for use in polishing the surface of a soft metal in a chemical mechanical polishing method, and said method comprising the steps in sequence of:

(a) providing an alumina particle containing liquid slurry;

(b) precipitating the alumina particle component of said slurry to separate said alumina particle component from supernatant liquid;

(c) removing a part of the supernatant liquid component from step (b) to produce a more concentrated slurry; and (d) adding hydrogen peroxide to the more concentrated slurry of step (c) to produce a polishing slurry consisting essentially of alumina particles, hydrogen peroxide and a liquid component in which the alumina particles comprise 2–10% by weight of the weight of said polishing slurry, and the hydrogen peroxide comprises 10–20% by weight of the liquid component of said polishing slurry.

4. The method as claimed in claim 3, wherein the alumina particles comprise 3–8% by weight of the weight of said polishing slurry.

5. A chemical mechanical polishing method for polishing the surface of a soft metal with a polishing slurry which includes alumina particles as polishing particles and hydrogen peroxide as oxidizing agent, comprising the steps in sequence of:

(a) providing an alumina particle containing liquid slurry;

(b) precipitating the alumina particle component of said slurry to separate said alumina particle component from supernatant liquid;

(c) removing a part of the supernatant liquid component from step (b) to produce a more concentrated slurry;

(d) adding hydrogen peroxide to the more concentrated slurry of step (c) to produce a polishing slurry consisting essentially of alumina particles, hydrogen peroxide and a liquid component in which the alumina particles comprise 2–10% by weight of the weight of said polishing slurry, and the hydrogen peroxide comprises 10–20% by weight of the liquid component of said polishing slurry; and (e) after adding said hydrogen peroxide in step (d), commencing chemical mechanical polishing using the polishing slurry from step (d).

6. The method as claimed in claim 5, wherein the alumina particles comprise 3–8% by weight of the total amount of said polishing slurry.

* * * * *